United States Patent
Jiang

(10) Patent No.: US 10,355,035 B2
(45) Date of Patent: Jul. 16, 2019

(54) MANUFACTURING METHOD OF BACK-CHANNEL-ETCHED (BCE) THIN FILM TRANSISTOR (TFT) SUBSTRATE

(71) Applicant: Shenzhen China Star Optoelectronics Semiconductor Display Technology Co., Ltd., Shenzhen (CN)

(72) Inventor: Chunsheng Jiang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/749,105

(22) PCT Filed: Dec. 20, 2017

(86) PCT No.: PCT/CN2017/117327
§ 371 (c)(1),
(2) Date: Jan. 30, 2018

(65) Prior Publication Data
US 2019/0157318 A1 May 23, 2019

(30) Foreign Application Priority Data
Nov. 21, 2017 (CN) .......................... 2017 1 1167386

(51) Int. Cl.
*H01L 27/12* (2006.01)
*H01L 29/66* (2006.01)
*H01L 29/45* (2006.01)
*H01L 21/3213* (2006.01)
*H01L 29/786* (2006.01)

(52) U.S. Cl.
CPC .... *H01L 27/1288* (2013.01); *H01L 21/32139* (2013.01); *H01L 27/1262* (2013.01); *H01L 29/45* (2013.01); *H01L 29/66969* (2013.01); *H01L 29/7869* (2013.01)

(58) Field of Classification Search
CPC ................. H01L 27/12; H01L 29/7869; H01L 29/66742; H01L 21/0273
See application file for complete search history.

(56) References Cited

U.S. PATENT DOCUMENTS

2008/0318368 A1* 12/2008 Ryu ................... H01L 29/7869
438/151
2010/0210056 A1* 8/2010 Seo ................... G02F 1/136227
438/34

FOREIGN PATENT DOCUMENTS

| CN | 103489902 A | 1/2014 |
|---|---|---|
| CN | 103715272 A | 4/2014 |
| CN | 104766891 A | 7/2015 |
| CN | 105140131 A | 12/2015 |
| JP | 2001196371 A | 7/2001 |

* cited by examiner

*Primary Examiner* — Dung A. Le
(74) *Attorney, Agent, or Firm* — Leong C. Lei

(57) ABSTRACT

A manufacturing method of the back-channel-etched (BCE) TFT substrate, able to prevent the passivation layer from curling up and forming bubbles, while not causing damaging to the channel region of the active layer.

6 Claims, 10 Drawing Sheets

MANUFACTURING METHOD OF BACK-CHANNEL-ETCHED (BCE) THIN FILM TRANSISTOR (TFT) SUBSTRATE

BACKGROUND OF THE INVENTION

1. Field of the Invention

The present invention relates to the field of display techniques, and in particular to a back-channel-etched thin film transistor (TFT) substrate and manufacturing method thereof.

2. The Related Arts

The liquid crystal display (LCD) provides advantages of thinness, low power-consumption and no radiation, and is widely used in, such as, LCD televisions, mobile phones, personal digital assistants (PDAs), digital cameras, computer screens, laptop screens, and so on.

The organic light-emitting diode (OLED) display device, also called organic electroluminescent display, is a new type of panel display device. Because the OLED display device provides the advantages of simple manufacturing process, low cost, low power consumption, high luminous efficiency, wide temperature range operation, thinness and lightness, short response time, ability to achieve color display and large-screen display, easy to realize matching with IC driver, and easy to realize flexible display, and is thus recognized as the most promising display device in the industry.

The OLED display can be classified into passive matrix OLED (PMOLED) and active matrix OLED (AMOLED) according to the driving mode, that is, the direct addressing and the thin film transistor (TFT) array addressing two categories. Among them, AMOLED has a pixel array, is an active display type, high luminous efficiency, and usually used for high-definition large-size display device.

The thin film transistor (TFT) is the main driving element in the LCD and AMOLED display device, and is directly related to the development trend of the high-performance panel display. The TFT has many types of structures, and can be manufactured in various materials. The amorphous silicon (a-Si) is the more common used material.

As the LCD and AMOLED display device develop towards the large-size and high-resolution, the only about 1 $cm^2/(Vs)$ mobility of the conventional a-Si has been unable to meet the requirements, while the metal oxide material, such as, indium gallium zinc oxide (IGZO) with the more than 10 $cm^2/(Vs)$ mobility, and the corresponding TFT fabrication compatibility with existing production line of a-Si semiconductors, has rapidly become the focus of research and development in recent years.

Compared to the conventional a-Si TFT, IGZO TFT provides the following advantages:

1. Improve the resolution of the display backplane: under the premise of guaranteeing the same transmittance, IGZO TFT display backplane resolution can be done more than 2 times of the a-Si TFT, as the carrier concentration of IGZO material is high and the mobility is high so as to reduce the size of the TFT, to ensure resolution improvement;

2. Reduce the energy consumption of the display device: compared to a-Si TFT and LTPS TFT, the leakage current of the IGZO TFT is less than 1 pA; the driving frequency is reduced from the original 30-50 Hz to 2-5 Hz, and can even reach 1 Hz through special process. Although the number of TFT driving times is reduced, the number still maintains the alignment of the LC molecules without affecting the quality of the image. As such, the power consumption of the display backplane is reduced. In addition, the high mobility of the IGZO semiconductor material enables the smaller size TFTs to provide sufficient charging ability and higher capacitance, and also improves the aperture ratio of the liquid crystal panel, the effective area of light penetration becomes larger, the same brightness can be achieved with fewer backplane components or low power consumption, and the energy consumption can be reduced;

3. by using intermittent driving, the influence of the noise of the LCD driving circuit on the touch screen detection circuit can be reduced, the higher sensitivity can be achieved, and even the tip of the ballpoint pen tip can respond. Moreover, the power can be cut off as the screen is not updated; therefore, the performance on the energy-saving performance is better.

Currently, the TFT with IGZO as semiconductor active layer generally adopts an etch stop layer (ESL) structure. The ESL can effectively protect the IGZO from being affected in the source-drain etching process, to ensure that TFT has excellent semiconductor properties. However, the manufacturing process of IGZO TFT with ESL structure is complicated and requires six photolithography processes, which is disabling for cost reduction. Therefore, the development of IGZO TFT with a back-channel-etched (BCE) structure with less photolithography processes is generally pursued.

Regardless of ESL-structured TFT or BCE-structured TFT, the metal of the source and the drain is covered with a passivation layer (PV). Unlike a-Si TFT, the material of the passivation layer of IGZO TFT is often $SiO_x$, and the metal for the source and the drain is Cu. Because the bonding between Cu and $SiO_x$ is weak, the passivation layer thin film on the metallic source and drain will curl up and form bubbles, resulting in poor yield rate.

SUMMARY OF THE INVENTION

The object of the present invention is to provide a manufacturing method of the back-channel-etched (BCE) TFT substrate, able to prevent the passivation layer from curling up and forming bubbles, while not causing damaging to the channel region of the active layer.

Another object of the present invention is to provide a BCE TFT substrate, preventing the passivation layer from curling up and forming bubbles, while providing stable electric properties.

To achieve the above object, the present invention provides a manufacturing method of back-channel-etched TFT substrate, comprising:

providing a base substrate, depositing metal on the base substrate and etching the metal to form a gate, forming a gate insulating layer on the base substrate and the gate;

forming an active layer on the gate insulating layer;

depositing a source-drain material layer on the active layer and the gate insulating layer, the source-drain material layer comprising: a first source-drain material layer disposed on the active layer and the gate insulating layer, a second source-drain material layer disposed on the first source-drain material, and a third source-drain material layer disposed on the second source-drain material layer; the first source-drain material layer comprising Mo, the second source-drain material layer comprising Cu, and the third source-drain material layer being a conductorized IGZO film;

defining a source-drain pattern region and a non-pattern region surrounding the source-drain pattern region on the source-drain material layer, with the source-drain pattern region comprising a source predetermined pattern region, a drain predetermined pattern region, and a source-drain spacer located between the source predetermined pattern region and the drain-target pattern region;

forming a photo-resist layer on the source-drain material layer, patternizing the photo-resist layer with a half-tone mask, removing the portion of the photo-resist layer corresponding to the non-pattern region, and thinning the portion of the photo-resist layer corresponding to the source-drain spacer;

removing the non-pattern region of the source-drain material layer by using a fluorine-containing etching solution;

performing an ashing process on remaining photo-resist layer to remove the portion of the photo-resist layer corresponding to the source-drain spacer, thinning the portions of the photo-resist layer corresponding to the source predetermined pattern region and the drain predetermined pattern region;

removing the source-drain spacer of the source-drain material layer by etching with a fluorine-free etchant;

stripping off remaining photo-resist layer to obtain the source and drain disposed at intervals;

forming a passivation layer on the source, the drain, the active layer and the gate insulating layer.

According to a preferred embodiment of the present invention, the conductorized IGZO film is prepared by magnetron sputtering; during the magnetron sputtering process, oxygen is not added into the reaction chamber, and the molar ratio of indium, gallium, zinc, and oxide in the obtained IGZO film is In:Ga:Zn:O=1:1:1:X, where X is less than 4.

According to a preferred embodiment of the present invention, the gate comprises a first gate layer disposed on the base substrate and a second gate layer disposed on the first gate layer, the material of first gate layer comprises Mo, and the material of the second gate layer comprises Cu.

According to a preferred embodiment of the present invention, the material of the active layer comprises IGZO.

According to a preferred embodiment of the present invention, the material of passivation layer comprises $SiO_x$.

The present invention also provides a back-channel-etched TFT substrate, comprising: a base substrate, a gate disposed on the base substrate, a gate insulating layer disposed on the base substrate and the gate, an active layer disposed on the gate insulating layer, a source and a drain disposed at interval on the active layer, and a passivation layer disposed on the source, the drain, and the active layer;

the source and the drain being formed by patternizing a source-drain material layer, the source-drain material layer comprising: a first source-drain material layer disposed on the active layer, a second source-drain material layer disposed on the first source-drain material, and a third source-drain material layer disposed on the second source-drain material layer; the first source-drain material layer comprising Mo, the second source-drain material layer comprising Cu, and the third source-drain material layer being a conductorized IGZO film.

According to a preferred embodiment of the present invention, the molar ratio of indium, gallium, zinc, and oxide in the conductorized IGZO film is In:Ga:Zn:O=1:1:1:X, where X is less than 4.

According to a preferred embodiment of the present invention, the gate comprises a first gate layer disposed on the base substrate and a second gate layer disposed on the first gate layer, the material of first gate layer comprises Mo, and the material of the second gate layer comprises Cu.

According to a preferred embodiment of the present invention, the material of the active layer comprises IGZO.

According to a preferred embodiment of the present invention, the material of passivation layer comprises $SiO_x$.

The present invention also provides a manufacturing method of back-channel-etched TFT substrate, comprising:

providing a base substrate, depositing metal on the base substrate and etching the metal to form a gate, forming a gate insulating layer on the base substrate and the gate;

forming an active layer on the gate insulating layer;

depositing a source-drain material layer on the active layer and the gate insulating layer, the source-drain material layer comprising: a first source-drain material layer disposed on the active layer and the gate insulating layer, a second source-drain material layer disposed on the first source-drain material, and a third source-drain material layer disposed on the second source-drain material layer; the first source-drain material layer comprising Mo, the second source-drain material layer comprising Cu, and the third source-drain material layer being a conductorized IGZO film;

defining a source-drain pattern region and a non-pattern region surrounding the source-drain pattern region on the source-drain material layer, with the source-drain pattern region comprising a source predetermined pattern region, a drain predetermined pattern region, and a source-drain spacer located between the source predetermined pattern region and the drain-target pattern region;

forming a photo-resist layer on the source-drain material layer, patternizing the photo-resist layer with a half-tone mask, removing the portion of the photo-resist layer corresponding to the non-pattern region, and thinning the portion of the photo-resist layer corresponding to the source-drain spacer;

removing the non-pattern region of the source-drain material layer by using a fluorine-containing etching solution;

performing an ashing process on remaining photo-resist layer to remove the portion of the photo-resist layer corresponding to the source-drain spacer, thinning the portions of the photo-resist layer corresponding to the source predetermined pattern region and the drain predetermined pattern region;

removing the source-drain spacer of the source-drain material layer by etching with a fluorine-free etchant;

stripping off remaining photo-resist layer to obtain the source and drain disposed at intervals;

forming a passivation layer on the source, the drain, the active layer and the gate insulating layer;

wherein the conductorized IGZO film being prepared by magnetron sputtering; during the magnetron sputtering process, no oxygen being added into the reaction chamber, and the molar ratio of indium, gallium, zinc, and oxide in the obtained IGZO film being In:Ga:Zn:O=1:1:1:X, where X being less than 4;

wherein the gate comprising a first gate layer disposed on the base substrate and a second gate layer disposed on the first gate layer, the material of first gate layer comprising Mo, and the material of the second gate layer comprising Cu;

wherein the material of the active layer comprising IGZO;

wherein the material of the passivation layer comprising $SiO_x$.

The present invention provides the following advantages. The manufacturing method of BCE TFT substrate of the present invention comprises disposing the surface layer of the source and drain as a conductorized IGZO film. Because the bonding between the conductorized IGZO film and the silicon oxide is strong, the passivation layer is prevented from curling up and forming bubbles. Moreover, in the process to form the source and drain the fluorine-free etching solution is used to remove the source-drain spacer, causing no damage to the channel region of the active layer. In the BCE TFT substrate of the present invention, the surface layer of the source and drain is disposed as a conductorized IGZO film. Because the bonding between the conductorized IGZO film and the silicon oxide is strong, the passivation layer is prevented from curling up and forming bubbles.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
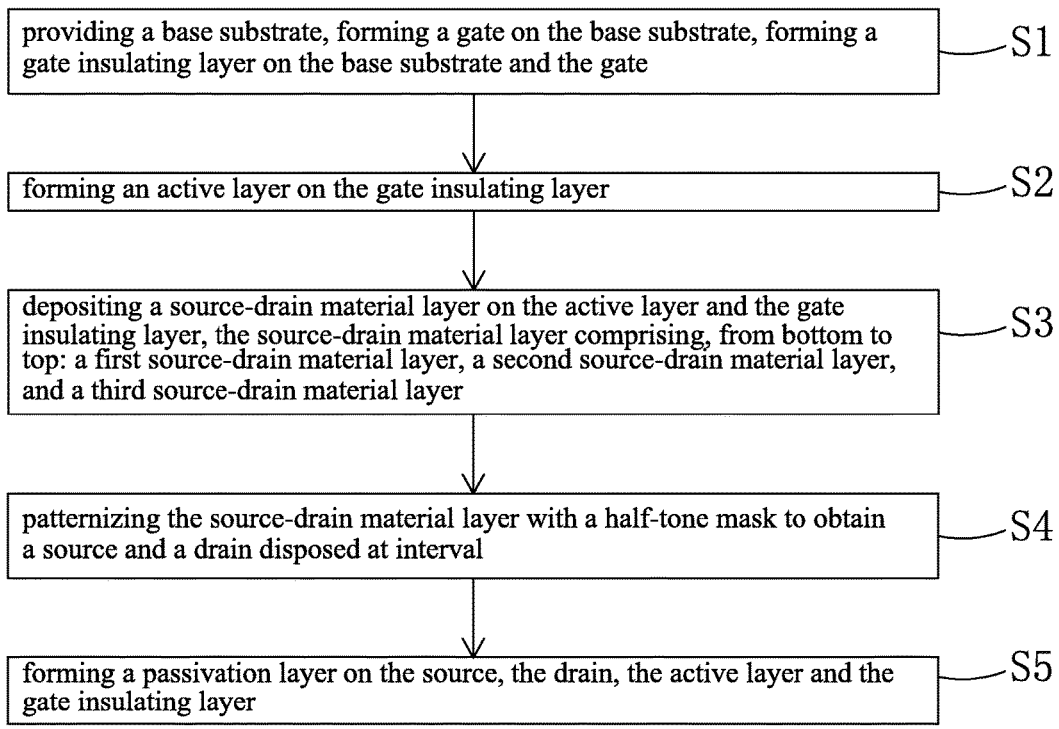
FIG. 1 is a schematic view showing a flowchart of the manufacturing method of BCE TFT substrate provided by an embodiment of the present invention.
Figure 2:
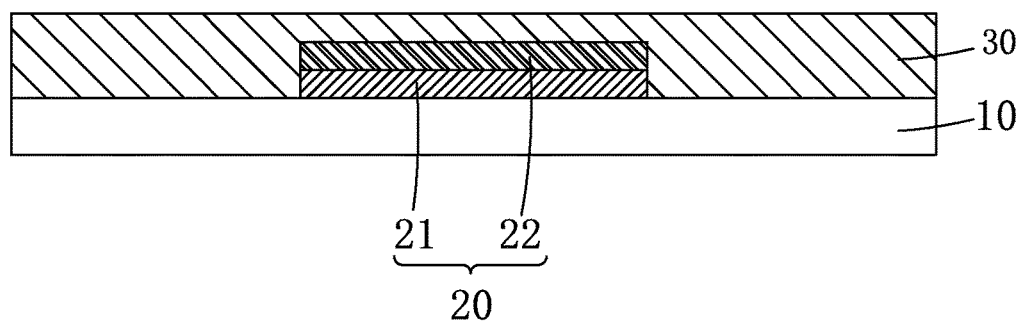
FIG. 2 is a schematic view showing Step S1 of the manufacturing method of the BCE TFT substrate provided by an embodiment of the present invention.

Referring to FIG. 1, the present invention provides a manufacturing method of back-channel-etched TFT substrate, comprising:

Step S1: as shown in FIG. 2, providing a base substrate 10, depositing metal on the base substrate 10 and etching the metal to form a gate 20, forming a gate insulating layer 30 on the base substrate 10 and the gate 20.

Specifically, the gate 20 comprises a first gate layer 21 disposed on the base substrate 10 and a second gate layer 22 disposed on the first gate layer 21, the material of first gate layer 21 comprises Mo, and the material of the second gate layer 22 comprises Cu.

Figure 3:
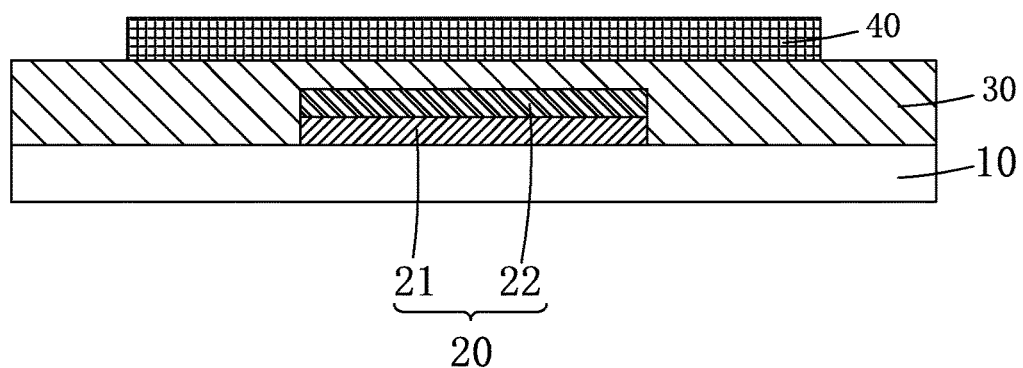
FIG. 3 is a schematic view showing Step S2 of the manufacturing method of the BCE TFT substrate provided by an embodiment of the present invention.

Step S2: as shown in FIG. 3, forming an active layer 40 on the gate insulating layer 30.

Specifically, the material of the active layer 40 comprises IGZO.

Specifically, the active layer 40 is formed by a sputtering depositing process and a photo-etching patternizing process.

Figure 4:
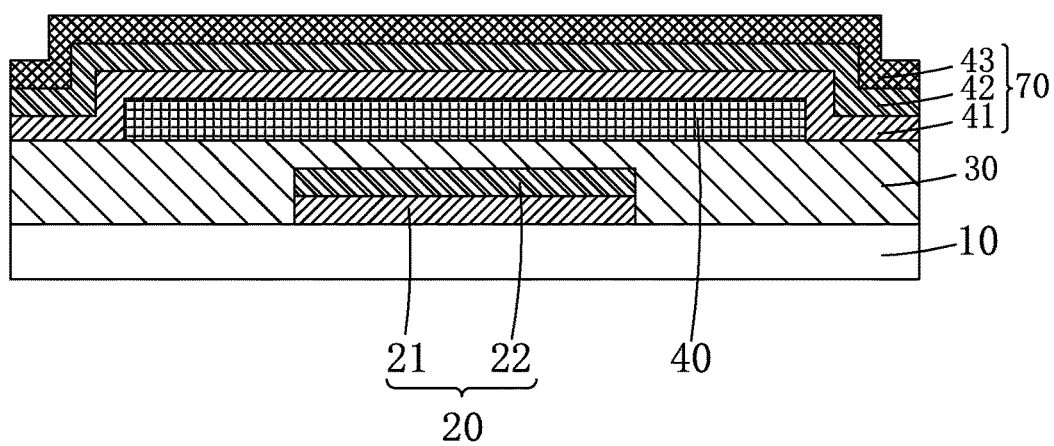
FIG. 4 is a schematic view showing Step S3 of the manufacturing method of the BCE TFT substrate provided by an embodiment of the present invention.

Step S3: as shown in FIG. 4, depositing a source-drain material layer 70 on the active layer 40 and the gate insulating layer 30, the source-drain material layer 70 comprising: a first source-drain material layer 41 disposed on the active layer 40 and the gate insulating layer 30, a second source-drain material layer 42 disposed on the first source-drain material 41, and a third source-drain material layer 43 disposed on the second source-drain material layer 42; the first source-drain material layer 41 comprising Mo, the second source-drain material layer 42 comprising Cu, and the third source-drain material layer 43 being a conductorized IGZO film.

Specifically, the conductorized IGZO film is prepared by magnetron sputtering; during the magnetron sputtering process, oxygen is not added into the reaction chamber, and the molar ratio of indium, gallium, zinc, and oxide in the obtained IGZO film is In:Ga:Zn:O=1:1:1:X, where X is less than 4.

Under the normal operation in the IGZO magnetron sputtering process, the reaction chamber will be injected with oxygen to ensure that the resulting IGZO layer of indium, gallium, zinc, and oxide ratio of In:Ga:Zn:O=1:1:1:4, thereby ensuring IGZO film has semiconducting properties. In the invention, the oxygen content in the conductorized IGZO film is reduced by removing the oxygen in the reaction chamber during the magnetron sputtering process to realize the conductor properties.

Figure 5:
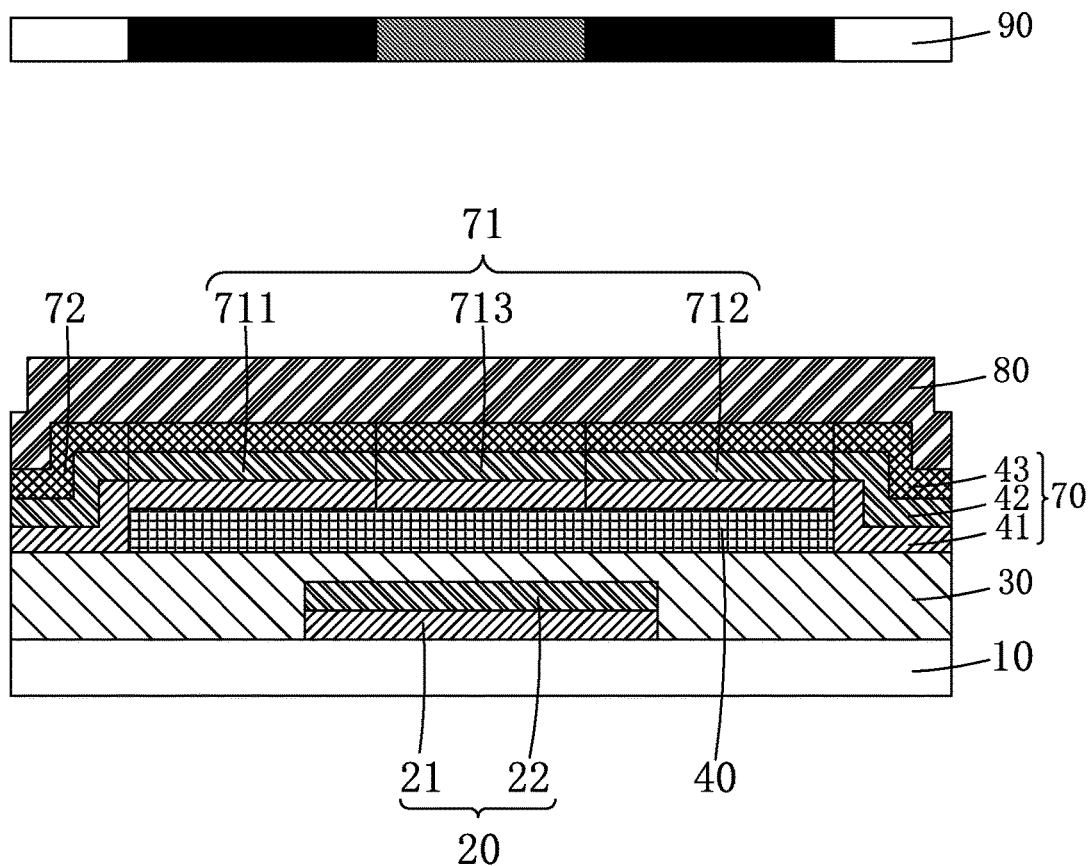
FIGS. 5-10 are schematic views showing Step S4 of the manufacturing method of the BCE TFT substrate provided by an embodiment of the present invention.
Figure 6:
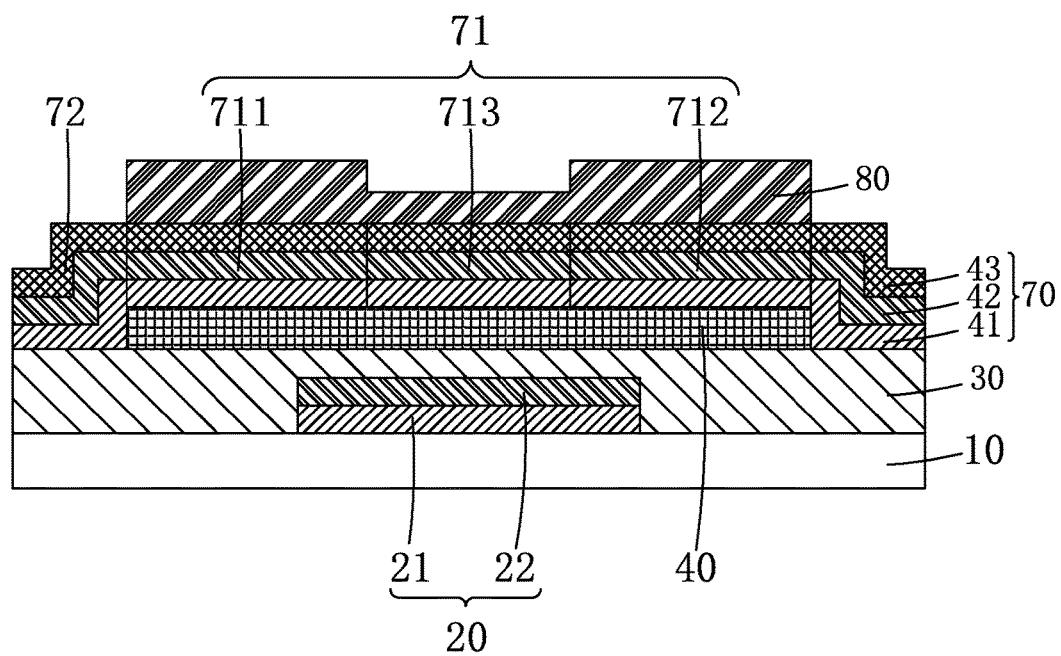
Figure 7:
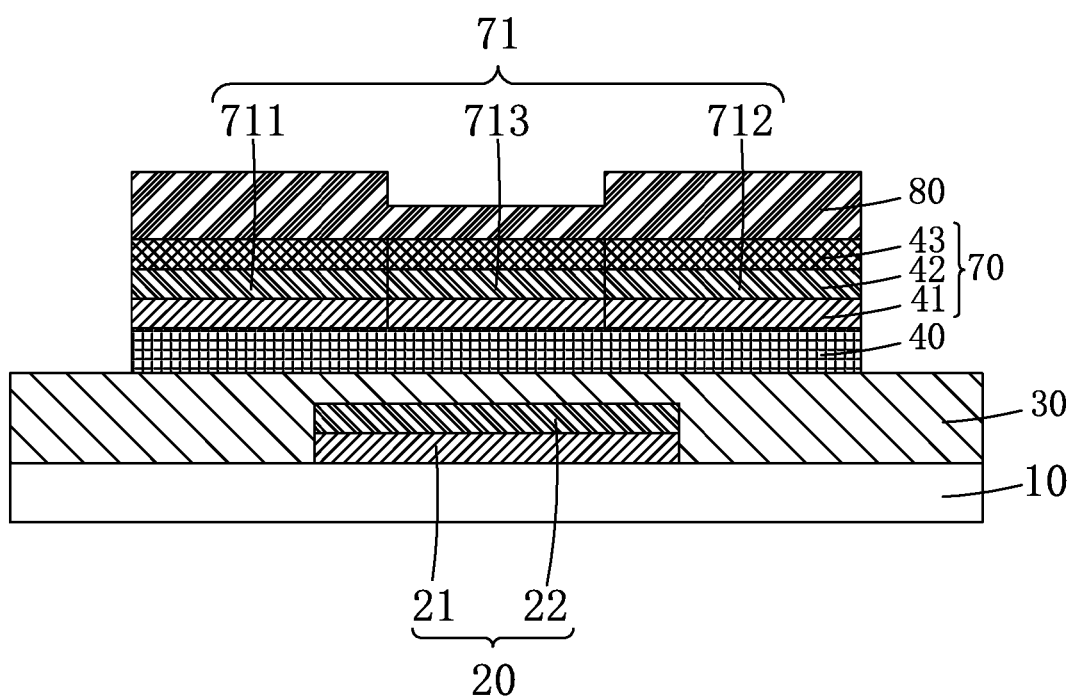

Step S4: as shown in FIGS. 5-6, defining a source-drain pattern region 71 and a non-pattern region 72 surrounding the source-drain pattern region 71 on the source-drain material layer 70, with the source-drain pattern region 71 comprising a source predetermined pattern region 711, a drain predetermined pattern region 712, and a source-drain spacer 713 located between the source predetermined pattern region 711 and the drain-target pattern region 712;

forming a photo-resist layer 80 on the source-drain material layer 70, patternizing the photo-resist layer 80 with a half-tone mask 90, removing the portion of the photo-resist layer 80 corresponding to the non-pattern region 72, and thinning the portion of the photo-resist layer 80 corresponding to the source-drain spacer 713;

as shown in FIG. 7, removing the non-pattern region 72 of the source-drain material layer 70 by using a fluorine-containing etching solution; the fluorine-containing etching solution able to etching the third source-drain material layer 43, the second source-drain material layer 42, and the first source-drain material layer 41, and the fluorine-containing etching solution having a faster etching effect on the third source-drain material layer 43, the second source-drain material layer 42, and the first source-drain material layer 41.

Specifically, the fluorine-containing etching solution is a fluorine-containing acidic copper etching solution, and the specific composition thereof is the prior art and is not described herein.

Figure 8:
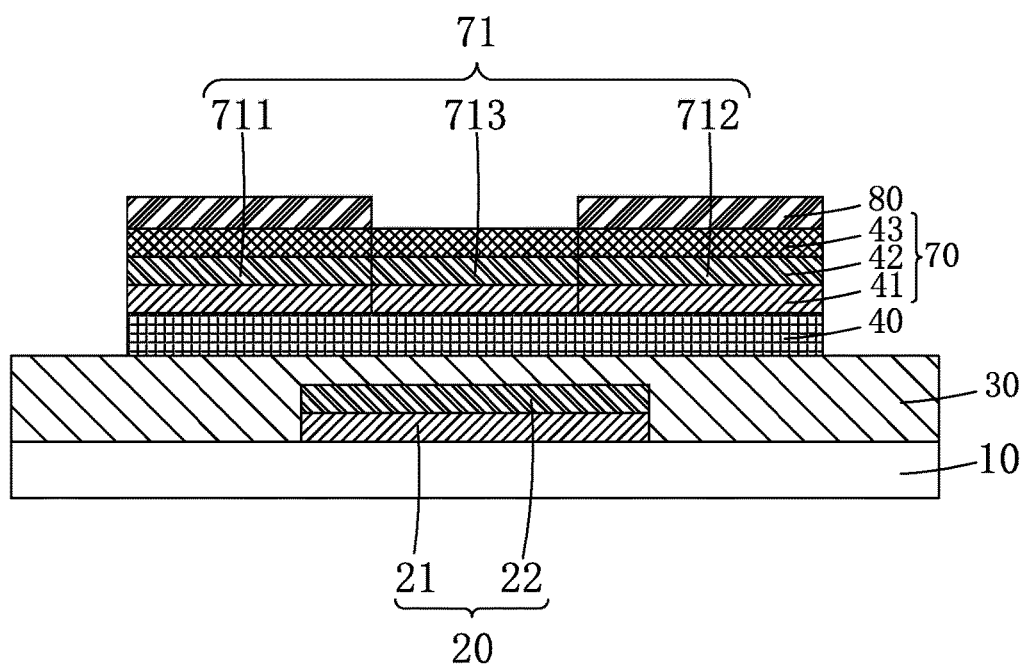
Figure 9:
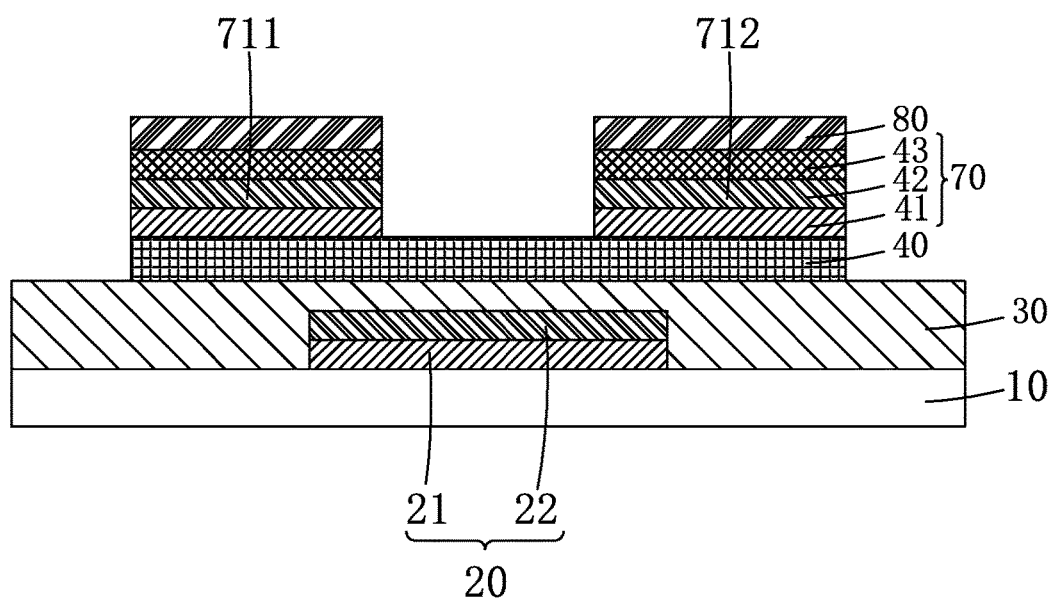

As shown in FIG. 8, performing an ashing process on remaining photo-resist layer 80 to remove the portion of the photo-resist layer 80 corresponding to the source-drain spacer 713, thinning the portions of the photo-resist layer 80 corresponding to the source predetermined pattern region 711 and the drain predetermined pattern region 712;

as shown in FIG. 9, removing the source-drain spacer 713 of the source-drain material layer 70 by etching with a fluorine-free etchant; the fluorine-free etching solution able to etching the third source-drain material layer 43, the second source-drain material layer 42, and the first source-drain material layer 41, and the fluorine-free etching solution having a faster etching effect on the second source-drain material layer 42, and the first source-drain material layer 41, and a slower etching effect on the third source-drain material layer 43, i.e., the fluorine-free etching solution having a slower etching speed than the fluorine-free etching solution on the IGZO.

Because the fluorine-free etching solution having a slower etching speed on IGZO, the use of fluorine-free etching solution on the source-drain spacer 713 of the source-drain material layer 70 can ensure that the channel region of the active layer 40 prepared with the IGZO material will not be damaged by controlling the etching time, leading to improvement of TFT device stability.

Specifically, the fluorine-free etching solution is a fluorine-free acidic copper etching solution, and the specific composition thereof is the prior art and is not described herein.

Figure 10:
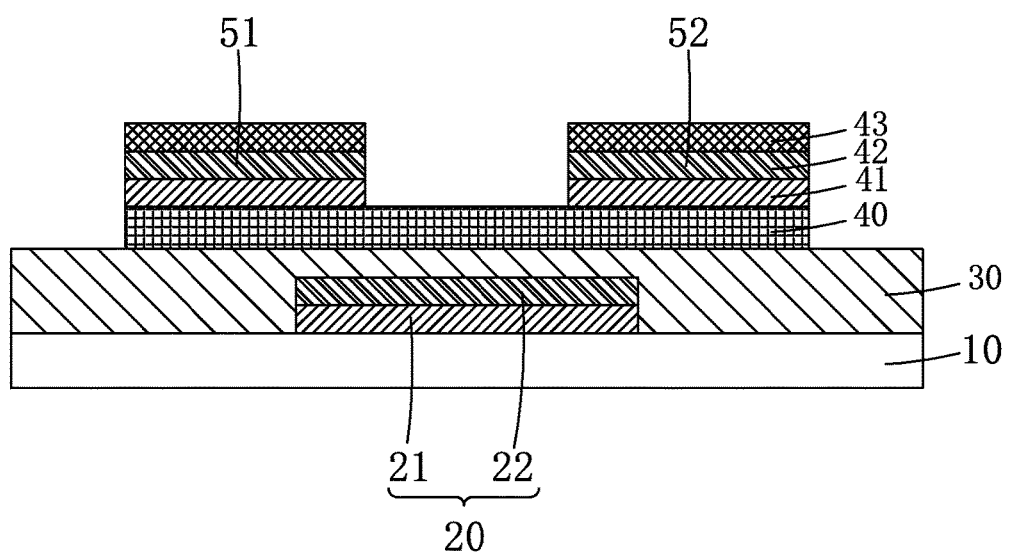

As shown in FIG. 10, stripping off remaining photo-resist layer 80 to obtain the source 51 and drain 52 disposed at intervals.

Other metal materials, such as Ti, have been used in the present invention to replace the conductorized UGZO to prepare the third source-drain material layer 43 to enhance the bonding strength between the source 51 and the drain 52 and the SiO$_x$. However, the second source-drain material layer 42 made of copper tends to form a solution battery with the third source-drain material layer 43 made of other metal materials, resulting in an electrochemical reaction so that in the processing of etching the source-drain material layer 70, the third source-drain material layer 43 made of other metal material is easily etched away to cause the photo-resist layer 80 above the third source-drain material layer 43 to be stripped off, resulting in the failure of the photo-etching process of the source 51 and the drain 52. In the present invention, the IGZO material is used to prepare the third source-drain electrode material layer 43 to enhance the bonding strength between the source 51 and the drain 52 and the SiO$_x$, the third source-drain material layer 43 made of conductorized IGZO material and the second source-drain material layer 42 made of the copper material will not form a solution battery, and no electrochemical reaction occurs. Therefore, during the etching of the source-drain material layer 70, the third source-drain material layer 43 will not be dissolved, and the photo-resist layer 80 above the third source-drain material layer 43 will not be stripped off.

Figure 11:
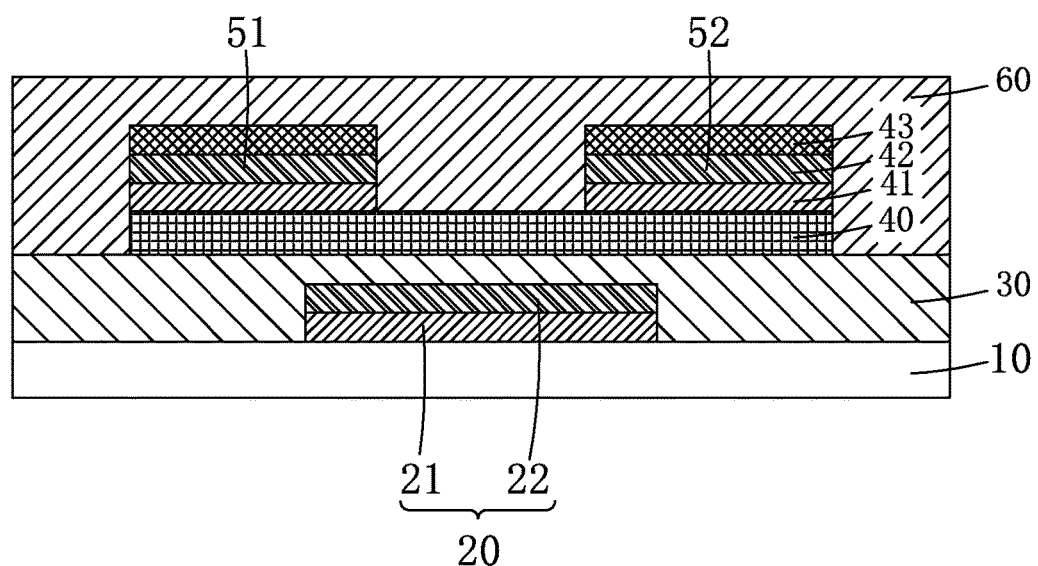
FIG. 11 is a schematic view showing Step S5 of the manufacturing method of the BCE TFT substrate and the structure of the BCE TFT substrate provided by an embodiment of the present invention.

Step S5: as shown in FIG. 11, forming a passivation layer 60 on the source 51, the drain 52, the active layer 40 and the gate insulating layer 30.

Specifically, the material of passivation layer comprises SiO$_x$.

Because the material of the surface layer of the source 51 and the drain 52, which is the third source-drain material layer 43, is a conductorized IGZO film, the bonding strength between the conductorized IGZO film and the silicon oxide is strong, so that the passivation layer 60 is prevented from curling up and forming bubbles.

The manufacturing method of BCE TFT substrate of the present invention comprises disposing the surface layer of the source 51 and drain 52 as a conductorized IGZO film. Because the bonding between the conductorized IGZO film and the silicon oxide is strong, the passivation layer 60 is prevented from curling up and forming bubbles. Moreover, in the process to form the source 51 and drain 52 the fluorine-free etching solution is used to remove the source-drain spacer, causing no damage to the channel region of the active layer 40.

Referring to FIG. 11, and FIGS. 2-10, the present invention also provides a back-channel-etched TFT substrate, comprising: a base substrate 10, a gate 20 disposed on the base substrate 10, a gate insulating layer 30 disposed on the base substrate 10 and the gate 20, an active layer 40 disposed on the gate insulating layer 30, a source 51 and a drain 52 disposed at interval on the active layer 40, and a passivation layer 60 disposed on the source 51, the drain 52, and the active layer 40;

the source 51 and the drain 52 being formed by patternizing a source-drain material layer 70, the source-drain material layer 70 comprising: a first source-drain material layer 41 disposed on the active layer 40, a second source-drain material layer 42 disposed on the first source-drain material 41, and a third source-drain material layer 43 disposed on the second source-drain material layer 42; the first source-drain material layer 41 comprising Mo, the second source-drain material layer 42 comprising Cu, and the third source-drain material layer 43 being a conductorized IGZO film.

Specifically, the molar ratio of indium, gallium, zinc, and oxide in the conductorized IGZO film is In:Ga:Zn:O=1:1:1:X, where X is less than 4.

Specifically, the gate 20 comprises a first gate layer 21 disposed on the base substrate 10 and a second gate layer 22 disposed on the first gate layer 21, the material of first gate layer 21 comprises Mo, and the material of the second gate layer 22 comprises Cu.

Specifically, the material of the active layer 40 comprises IGZO.

In the BCE TFT substrate of the present invention, the surface layer of the source 51 and drain 52 is disposed as a conductorized IGZO film. Because the bonding between the conductorized IGZO film and the silicon oxide is strong, the passivation layer 60 is prevented from curling up and forming bubbles.

In summary, the present invention provides a BCE TFT substrate and manufacturing method thereof. The manufacturing method of BCE TFT substrate of the present invention comprises disposing the surface layer of the source and drain as a conductorized IGZO film. Because the bonding between the conductorized IGZO film and the silicon oxide is strong, the passivation layer is prevented from curling up and forming bubbles. Moreover, in the process to form the source and drain the fluorine-free etching solution is used to remove the source-drain spacer, causing no damage to the channel region of the active layer. In the BCE TFT substrate of the present invention, the surface layer of the source and drain is disposed as a conductorized IGZO film. Because the bonding between the conductorized IGZO film and the silicon oxide is strong, the passivation layer is prevented from curling up and forming bubbles.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of back-channel-etched (BCE) thin film transistor (TFT) substrate, comprising:
providing a base substrate, depositing metal on the base substrate and etching the metal to form a gate, forming a gate insulating layer on the base substrate and the gate;
forming an active layer on the gate insulating layer;
depositing a source-drain material layer on the active layer and the gate insulating layer, the source-drain material layer comprising: a first source-drain material layer disposed on the active layer and the gate insulating layer, a second source-drain material layer disposed on the first source-drain material, and a third source-drain material layer disposed on the second source-drain material layer; the first source-drain material layer comprising Mo, the second source-drain material layer comprising Cu, and the third source-drain material layer being a conductorized IGZO film;
defining a source-drain pattern region and a non-pattern region surrounding the source-drain pattern region on the source-drain material layer, with the source-drain pattern region comprising a source predetermined pattern region, a drain predetermined pattern region, and a source-drain spacer located between the source predetermined pattern region and a drain-target pattern region;
forming a photo-resist layer on the source-drain material layer, patternizing the photo-resist layer with a half-tone mask, removing the portion of the photo-resist layer corresponding to the non-pattern region, and thinning the portion of the photo-resist layer corresponding to the source-drain spacer;
removing the non-pattern region of the source-drain material layer by using a fluorine-containing etching solution;
performing an ashing process on remaining photo-resist layer to remove the portion of the photo-resist layer corresponding to the source-drain spacer, thinning the portions of the photo-resist layer corresponding to the source predetermined pattern region and the drain predetermined pattern region;
removing the source-drain spacer of the source-drain material layer by etching with a fluorine-free etchant
stripping off remaining photo-resist layer to obtain the source and drain disposed at interval;
forming a passivation layer on the source, the drain, the active layer and the gate insulating layer.

2. The manufacturing method of BCE TFT substrate as claimed in claim 1, wherein the conductorized IGZO film is prepared by magnetron sputtering; during the magnetron sputtering process, oxygen is not added into the reaction chamber, and the molar ratio of indium, gallium, zinc, and oxide in the obtained IGZO film is In:Ga:Zn:O=1:1:1:X, where X is less than 4.

3. The manufacturing method of BCE TFT substrate as claimed in claim 1, wherein the gate comprises a first gate layer disposed on the base substrate and a second gate layer disposed on the first gate layer, the material of first gate layer comprises Mo, and the material of the second gate layer comprises Cu.

4. The manufacturing method of BCE TFT substrate as claimed in claim 1, wherein the material of the active layer comprises IGZO.

5. The manufacturing method of BCE TFT substrate as claimed in claim 1, wherein the material of the passivation layer comprises $SiO_x$.

6. A manufacturing method of back-channel-etched (BCE) thin film transistor (TFT) substrate, comprising:
providing a base substrate, depositing metal on the base substrate and etching the metal to form a gate, forming a gate insulating layer on the base substrate and the gate;
forming an active layer on the gate insulating layer;
depositing a source-drain material layer on the active layer and the gate insulating layer, the source-drain material layer comprising: a first source-drain material layer disposed on the active layer and the gate insulating layer, a second source-drain material layer disposed on the first source-drain material, and a third source-drain material layer disposed on the second source-drain material layer; the first source-drain material layer comprising Mo, the second source-drain material layer comprising Cu, and the third source-drain material layer being a conductorized IGZO film;
defining a source-drain pattern region and a non-pattern region surrounding the source-drain pattern region on the source-drain material layer, with the source-drain pattern region comprising a source predetermined pattern region, a drain predetermined pattern region, and a source-drain spacer located between the source predetermined pattern region and a drain-target pattern region;
forming a photo-resist layer on the source-drain material layer, patternizing the photo-resist layer with a half-tone mask, removing the portion of the photo-resist layer corresponding to the non-pattern region, and thinning the portion of the photo-resist layer corresponding to the source-drain spacer;
removing the non-pattern region of the source-drain material layer by using a fluorine-containing etching solution;
performing an ashing process on remaining photo-resist layer to remove the portion of the photo-resist layer corresponding to the source-drain spacer, thinning the portions of the photo-resist layer corresponding to the source predetermined pattern region and the drain predetermined pattern region;
removing the source-drain spacer of the source-drain material layer by etching with a fluorine-free etchant;
stripping off remaining photo-resist layer to obtain the source and drain disposed at interval;
forming a passivation layer on the source, the drain, the active layer and the gate insulating layer;
wherein the conductorized IGZO film being prepared by magnetron sputtering; during the magnetron sputtering process, no oxygen being added into the reaction chamber, and the molar ratio of indium, gallium, zinc, and oxide in the obtained IGZO film being In:Ga:Zn:O=1: 1:1:X, where X being less than 4;
wherein the gate comprising a first gate layer disposed on the base substrate and a second gate layer disposed on the first gate layer, the material of first gate layer comprising Mo, and the material of the second gate layer comprising Cu;
wherein the material of the active layer comprising IGZO;
wherein the material of the passivation layer comprising $SiO_x$.

* * * * *